(12) United States Patent
Menezo et al.

(10) Patent No.: US 12,021,347 B2
(45) Date of Patent: Jun. 25, 2024

(54) PHOTONIC CHIP WITH BURIED LASER SOURCE

(71) Applicant: COMMISSARIAT A L'ÉNERGIE ATOMIQUE ET AUX ÉNERGIES ALTERNATIVES, Paris (FR)

(72) Inventors: Sylvie Menezo, Grenoble (FR); Séverine Cheramy, Grenoble (FR)

(73) Assignee: COMMISSARIAT A L'ÉNERGIE ATOMIQUE ET AUX ÉNERGIES ALTERNATIVES, Paris (FR)

( * ) Notice: Subject to any disclaimer, the term of this patent is extended or adjusted under 35 U.S.C. 154(b) by 784 days.

(21) Appl. No.: 16/972,370

(22) PCT Filed: May 14, 2019

(86) PCT No.: PCT/FR2019/051082
§ 371 (c)(1),
(2) Date: Dec. 4, 2020

(87) PCT Pub. No.: WO2019/234323
PCT Pub. Date: Dec. 12, 2019

(65) Prior Publication Data
US 2021/0234334 A1    Jul. 29, 2021

(30) Foreign Application Priority Data
Jun. 8, 2018  (FR) ...................................... 1855010

(51) Int. Cl.
*H01S 3/04* (2006.01)
*H01S 5/022* (2021.01)
(Continued)

(52) U.S. Cl.
CPC .......... *H01S 5/02469* (2013.01); *H01S 5/022* (2013.01); *H01S 5/023* (2021.01);
(Continued)

(58) Field of Classification Search
CPC ...... H01S 5/02469; H01S 5/022; H01S 5/023; H01S 5/02325; H01S 5/026; H01S 5/04257; H01S 5/11
See application file for complete search history.

(56) References Cited

U.S. PATENT DOCUMENTS 7,639,719 B2    12/2009  Fang et al.
2003/0038344 A1  2/2003  Palmer et al.
(Continued)

FOREIGN PATENT DOCUMENTS

FR          3 023 066 A1      1/2016
WO      WO 2018/200059 A1    11/2018

OTHER PUBLICATIONS

International Search Report dated Oct. 4, 2019 in PCT/FR2019/051082 filed May 14, 2019.
(Continued)

*Primary Examiner* — Kinam Park
(74) *Attorney, Agent, or Firm* — Oblon, McClelland, Maier & Neustadt, L.L.P.

(57) ABSTRACT

A photonic chip includes an optical layer bonded, via a bonding interface, to a carrier, and a laser source having a waveguide encapsulated in an encapsulating sublayer of the optical layer, the waveguide having a first electrical contact embedded in the encapsulating sublayer. The photonic chip also includes an interconnect metal network forming a via that extends, in the optical layer, from the bonding interface to the first embedded electrical contact of the waveguide, the interconnect metal network having metal vias that electrically connect to one another metals lines that extend mainly parallel to the plane of the chip, the metal lines being arranged one above the other within the optical layer.

10 Claims, 5 Drawing Sheets

(51) Int. Cl.
*H01S 5/023* (2021.01)
*H01S 5/02325* (2021.01)
*H01S 5/024* (2006.01)
*H01S 5/026* (2006.01)
*H01S 5/042* (2006.01)
*H01S 5/11* (2021.01)

(52) U.S. Cl.
CPC .......... *H01S 5/02325* (2021.01); *H01S 5/026* (2013.01); *H01S 5/04257* (2019.08); *H01S 5/11* (2021.01)

(56) References Cited

U.S. PATENT DOCUMENTS

| | | |
|---|---|---|
| 2004/0201095 A1 | 10/2004 | Palmer et al. |
| 2009/0168821 A1 | 7/2009 | Fang et al. |
| 2009/0296367 A1 | 12/2009 | Sekine et al. |
| 2011/0248397 A1 | 10/2011 | Coffy et al. |
| 2012/0155055 A1 | 6/2012 | Kang et al. |
| 2014/0264400 A1* | 9/2014 | Lipson .................... H01L 25/50 257/432 |
| 2014/0376857 A1* | 12/2014 | Chantre ................ H01S 5/1032 438/31 |
| 2016/0005711 A1 | 1/2016 | Kang et al. |
| 2016/0047986 A1 | 2/2016 | Chantre et al. |
| 2016/0141467 A1 | 5/2016 | Li et al. |
| 2017/0133356 A1* | 5/2017 | Mercier .................. H01L 33/08 |
| 2017/0309593 A1 | 10/2017 | Kang et al. |
| 2018/0006427 A1* | 1/2018 | Sciancalepore ....... H01S 5/3013 |

OTHER PUBLICATIONS

Durel, J., et al., "First Demonstration of a Back-Side Integrated Heterogeneous Hybrid III-V/Si DRB Lasers for Si-Photonics Applications", *IEEE International Electron Devices Meeting (IEDM)*, IEEE, XP033055031, 2016, 4 total pages.

Beilliard, Y., et al., "Chip to wafer copper direct bonding electrical characterization and thermal cycling", IEEE, 2013, 7 total pages.

Zhang, C., et al., "Thermal management of Hybrid Silicon Ring Lasers for High Temperature Operation", IEEE Journal of Selected Topics In Quantum Electronics, vol. 21, No. 6, 2015, 7 total pages.

Miyairi, K., et al., "Full integration and Electrical Characterization of 3D Silicon Interposer Demonstrator Incorporating High Density TSVs and Interconnects", 45$^{th}$ International Symposium on Microelectronics, 2012, pp. 000984-000990.

Shin, D., et al., "O-band DFB laser heterogeneously integrated on a bulk-silicon platform", Optics Express, vol. 26, No. 11, 2018, 7 total pages.

Sysak, M., et al., "Hybrid Silicon Laser Technology: A Thermal Perspective", IEEE Journal of Selected Topics in Quantum Electronics, vol. 17, No. 6, 2011, pp. 1490-1498.

Yang, Y., et al., "Through-Si-via (TSV) Keep-Out-Zone (KOZ) in SOI Photonics Interposer: A Study of the Impact of TSV-Induced Stress on SI Ring Resonators", IEEE Photonics Journal, vol. 5, No. 6, XP002788522, 2013, 12 total pages.

* cited by examiner

PHOTONIC CHIP WITH BURIED LASER SOURCE

The invention relates to a photonic chip comprising a buried laser source and to a process for fabricating such a photonic chip.

The photonic chips essentially lie in a plane called the "plane of the chip" below.

Known photonic chips comprise:
- a substrate having upper and lower faces parallel to the plane of the chip, this substrate comprising, between the upper and lower faces:
  - a carrier of thickness larger than 50 µm, this carrier being devoid of optical component,
  - an optical layer bonded, via a bonding interface, to the carrier, this optical layer comprising, in succession, from the upper face to the bonding interface:
    - an oxide sublayer, and
    - an encapsulating sublayer,
  - a laser source buried in the optical layer, this laser source comprising a waveguide that is produced on the side of the oxide sublayer which faces the bonding interface and that is encapsulated in a dielectric material of the encapsulating layer, this waveguide comprising a first electrical contact embedded in the encapsulating sublayer.

Such a photonic chip is for example described in the following article: J. Durel et al.: "First Demonstration of a Back-Side Integrated Heterogeneous Hybrid III-V/Si DBR Lasers for Si-Photonics Applications", IEEE International Electron Devices Meeting (IEDM), December 2016.

This chip has the advantage of being particularly simple to fabricate. However, it would be desirable, while retaining this advantage, to improve it even further by improving the thermal dissipation of the heat generated by the laser source while it is operating. To this end, the invention relates to such a photonic chip in which the photonic chip comprises an interconnect metal network forming a via that extends, in the optical layer, from the bonding interface to the first embedded electrical contact of the waveguide, this interconnect metal network comprising metal vias that electrically connect together metal lines that extend mainly parallel to the plane of the chip, these metal lines being arranged one above the other within the optical layer.

Embodiments of this photonic chip may comprise one or more of the features of the dependent claims.

Another subject of the invention is a process for fabricating the photonic chip that is the first subject of the present patent application.

The invention will be better understood on reading the following description. It is given merely by way of non-limiting example and makes reference to the drawings, in which.

In these figures, the same references have been used to designate the same elements. In the rest of this description, features and functions that are well known to those skilled in the art will not be described in detail.

Section I: Exemplary Embodiments

Figure 1:
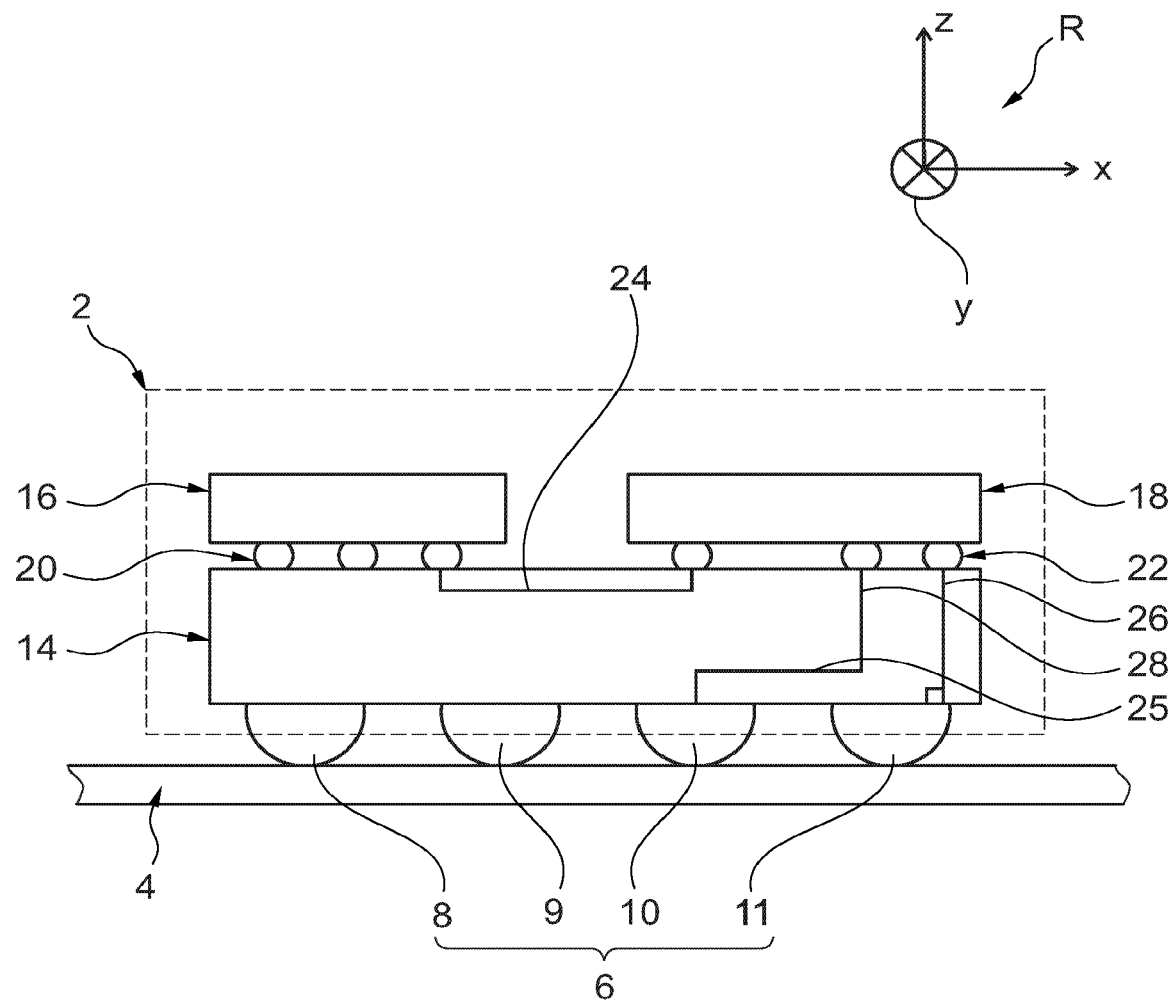
FIG. 1 is a schematic illustration of a system comprising a photonic chip.

FIG. 1 shows a segment of a system 2 soldered to a printed circuit board 4 or PCB via an array 6 of solder bumps. To simplify the illustration, only four bumps 8 to 11 of the array 6 have been shown.

The system 2 typically takes the form of a parallelepipedal package inside of which electronic and optical chips are housed. Only the solder bumps of the system 2 protrude from a lower face of this package. To simplify the illustration, this package has not been shown in FIG. 1. The system 2 in its package is known as a "system in package". More generically, the system 2 is also often designated an "integrated circuit".

In the remainder of this description, the horizontal is defined in the figures by the X- and Y-directions of an orthogonal coordinate system R. The Z-direction of the coordinate system R corresponds to the vertical direction. Terms such as "lower", "upper", "above", "below", "top" and "bottom" are defined with respect to this Z-direction.

In its lower portion, the system 2 comprises a carrier 14. The bumps of the array 6 are placed directly on the lower face of the carrier 14. The carrier 14 and the array 6 are together known as a BGA (acronym of "ball grid array"). The upper face of the carrier 14 comprises pads to which electronic and/or photonic chips may be soldered. In the particular case of FIG. 1, the system 2 comprises one electronic chip 16 and one photonic chip 18. These two chips 16 and 18 are both directly soldered to the upper face of the carrier 14.

The electronic chip only comprises electronic components that are connected to one another with a view to performing preset functions. The electronic chip 16 is therefore devoid of optical component.

In contrast, the photonic chip 18 comprises optical components for performing preset functions. An optical component is a component that, during its use, generates or modifies or guides an optical signal. Typically, the wavelength λ of the optical signal is comprised between 1200 nm and 1700 nm. Generally, at least one of these optical components is an active optical component, i.e. an optical component:
- that must be supplied with an electric current or voltage to function correctly, and/or
- that converts an optical signal into an electrical signal (case of a photodetector), or that converts an electrical signal into an optical signal (case of a light modulator).

In this embodiment, the photonic chip 18 is devoid of electronic component.

With a view to the supply of electricity or the exchange of electrical signals, the photonic chip 18 and the electronic chip 16 of the system 2 are electrically connected to pads on the upper face of the carrier 14. The chips 16 and 18 are also electrically connected to printed circuit board 4. To this end, here, the chips 16 and 18 are soldered to respective pads of the upper face of the carrier 14 by way of solder microbump arrays, 20 and 22, respectively. In FIG. 1, the arrays 20 and 22 have been represented by a few of these solder microbumps located under the chips 16 and 18. For example, solder microbumps are what are known as "C4 Bumps".

The carrier 14 comprises electrical connections that extend mainly horizontally, such as a connection 24. The connection 24 electrically connects together certain pads of the upper face of the carrier 14 in order to allow the exchange of electrical signals or power between the chips soldered to these pads. The carrier 14 is also passed through by vertical connections, such as the connections 26 and 28. Generally, these vertical connections open onto a horizontal metal line of a redistribution layer (RDL). Here, only one line 25 of this redistribution layer has been illustrated. The horizontal lines of the redistribution layer electrically connect certain of the vertical connections to corresponding solder bumps of the array 6. The vertical connections notably allow the chips 16 and 18 to be supplied with electrical power and, also, electrical signals to be exchanged with other chips soldered to the printed circuit board 4. Apart from the horizontal and vertical connections, the carrier 14 is generally devoid of any electrical or optical component.

Figure 2:
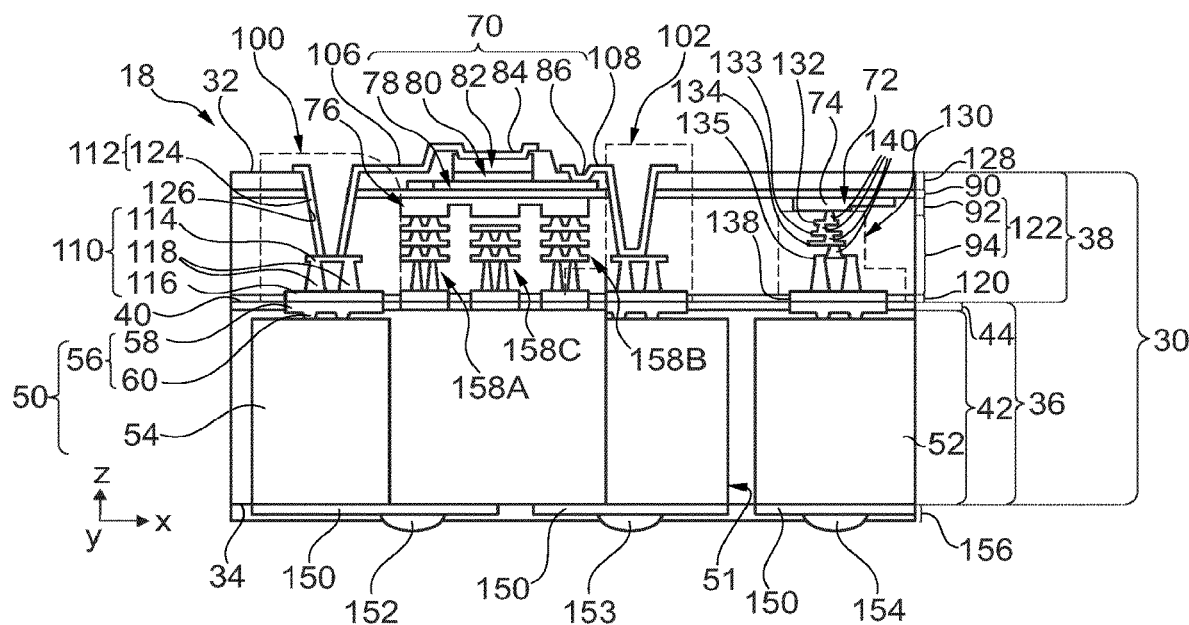
FIG. 2 is a schematic illustration, in vertical cross section, of the photonic chip of the system of FIG. 1.

FIG. 2 shows in more detail a segment of the photonic chip 18. The chip 18 comprises a substrate 30 having a horizontal upper face 32 and a horizontal lower face 34. Between these faces 32 and 34, the substrate 30 comprises, stacked directly one on top of the other, from bottom to top:
   an interconnect layer 36, and
   an optical layer 38.

More precisely, the layers 36 and 38 are directly bonded to each other via a bonding interface 40 that lies essentially in a horizontal plane. The upper face of the layer 38 corresponds to the upper face 32 and the lower face of the layer 36 corresponds to the lower face 34.

The layer 36 is mainly made of a non-conductive material. In this description, the expression "non-conductive material" denotes a material the conductivity of which at 20° C. is lower than $10^{-1}$ or $10^{-2}$ S/m. Thus, this non-conductive material may be a semiconductor such as undoped silicon or an electrically insulating material such as glass. An electrically insulating material is a material the conductivity of which at 20° C. is lower than $10^{-9}$ S/m and, preferably, lower than $10^{-15}$ S/m or $10^{-16}$ S/m. Below, an electrically insulating material is also referred to as a "dielectric material". Here, the non-conductive material is undoped crystalline silicon. In contrast, in this description, the expression "conductive material" or "electrically conductive material" denotes a material the electrical conductivity of which at 20° C. is generally higher than $10^5$ or $10^6$ S/m.

Here, the layer 36 comprises a sublayer 42 made of undoped crystalline silicon and a surface sublayer 44 produced directly on the sublayer 42. Here the sublayer 44 is made of silicon dioxide.

The lower face of the sublayer 42 corresponds to the face 34. The thickness of the sublayer 42 is quite large in order to be quite rigid and to not exhibit too much bow. In particular, the thickness of the sublayer 42 is sufficient to allow the chip 18 to be handled. Thus, the layer 36 forms a carrier for the optical layer 38. To this end, the thickness of the sublayer 42 is larger than 50 µm or than 80 µm or than 100 µm.

The sublayer 42 comprises vias, called "primary vias" below, that allow electrical connections that pass vertically through the substrate 30 to be formed. Each primary via extends from a lower end to an upper end. The lower end lies flush with the lower face 34. The upper end lies flush with the bonding interface 40. These primary vias therefore pass right through the thickness of the interconnect layer 36. In contrast, the primary vias do not pass through and do not penetrate into the optical layer 38.

The layer 36 does not contain a layer of buried silicon oxide. The smallest thickness thereof resulting in an acceptable bow is therefore smaller than that of a layer containing such a layer of buried silicon oxide. A smaller thickness notably allows the parasitic capacitance of the primary vias, which is proportional to the height of the primary vias, to be decreased. Thus, preferably, the thickness of the sublayer 42 is also smaller than 150 µm or 100 µm.

FIG. 2 shows only three primary vias 50 to 52. However, in general, layer 36 comprises a much higher number of primary vias. For example, all the primary vias are structurally identical and hence, below, only the primary via 50 will be described in more detail.

The primary via 50 is produced in a conventional manner. For example, on this subject, the reader may consult the following article: Ken Miyairi et al.: "Full integration and electrical characterization of 3D Silicon Interposer demonstrator incorporating high density TSVs and interconnects", 45th International Symposium on Microelectronics, 2012. Thus, below, only a few details of the via 50 are described.

In this embodiment, the via 50 is formed, from bottom to top:
   from a lower portion 54 taking the form of a vertical bar, and
   from an upper portion 56 taking the form of an interconnect metal network.

The lower portion 54 extends vertically from the lower end of the via 50 to the upper portion 56. The horizontal cross-sectional area of the lower portion is substantially constant over its entire height. Its height and its diameter are denoted H1 and D1 below, respectively. The lower portion 54 passes through at least 80% and, preferably, at least 90% or 95% of the thickness of the layer 36. Since the thickness of the layer 36 is large, the diameter D1 is also large so that the aspect ratio H1/D1 is lower than 10/1 or 8/1. Specifically, it is difficult to fabricate vias having an aspect ratio higher than 10/1. Here, the height H1 is larger than 80% or 90% or 95% of the thickness of the sublayer 42. Under these conditions, the height H1 is comprised between 80 µm and 142.5 µm and, generally, comprised between 95 µm and 130 µm. The diameter D1 is then typically comprised between 10 µm and 20 µm. In the case where the sublayer 42 is made of a semiconductor such as silicon, preferably, the lower portion 54 is electrically insulated from this semiconductor by a thin coating of electrically insulating material. To simplify the figures, this coating of electrically insulating material has not been shown. The lower portion 54 is made of metal and, for example, of copper.

The upper portion 56 of the via 50 is formed by an interconnect metal network. This upper portion 56 therefore consists of:
   metal lines that extend mainly horizontally, and
   metal vias that electrically connect together these metal lines.

It will be recalled that a "via" is a vertical electrical connection, i.e. one that extends mainly in a direction perpendicular to the plane of the photonic chip.

The metal lines and, preferably, the metal vias are produced in the silicon-oxide sublayer 44. Here, the upper portion 56 comprises:
   a metal line 58 that lies flush with the bonding interface 40, and
   metal vias 60 that connect this line 58 directly to the top of the lower portion 54.

In this description, the expression "metal via" denotes a via made of metal and the diameter of which is generally small, i.e. the diameter of which is smaller than 3 μm and, often, smaller than 1 μm. The height of a metal via is also small, i.e. smaller than 3 μm or 1 μm.

Here the metal is copper. The structure of such an interconnect metal network is well known to those skilled in the art. It is a question of the interconnect metal network of the redistribution layer or RDL.

The thickness of the sublayer 44 is typically smaller than 10 μm or 3 μm.

The diameter of the upper portion 56 is equal to the maximum diameter of a metal via thereof. Here, the diameter of the upper portion 56 is therefore smaller than 10 μm and, generally, smaller than 3 μm or 1 μm.

The optical layer 38 comprises at least one optical component buried in this layer. Here, the optical component is chosen from the group consisting of an optical modulator, a laser source, a waveguide, a photodetector, a demultiplexer and an optical multiplexer. Among the optical components of this group, all are active optical components with the exception of the waveguide.

In this exemplary embodiment, only two optical components 70, 72 buried in the layer 38 have been shown. The component 70 is a laser source and the component 72 is an optical modulator. The component 72 is capable of modifying, depending on an electrical control signal, the phase, the amplitude or the intensity of an optical signal passing through it. Such optical modulators are well known and hence the component 72 is not described in detail here. The component 72 comprises an electrical contact 74 intended to receive the electrical control signal. Here, this electrical contact 74 is embedded in the optical layer 38. In this embodiment, the electrical contact 74 is located on a lower face of the component 72. The electrical contact 74 therefore faces the bonding interface 40. In this configuration, the electrical contact 74 is only accessible from below the optical component 72.

The component 70 is a hybrid III-V/silicon laser source. The component 70 is for example a distributed feedback (DFB) laser or a distributed Bragg reflector (DBR) laser. Such a laser source is well known to those skilled in the art and is therefore not described in detail here. Here, the component 70 notably comprises a waveguide 76 and, stacked directly on top of one another:

a lower layer 78 made of n-doped semiconductor,
an active layer 80, and
an upper layer 82 made of p-doped semiconductor.

The component 70 also comprises an upper contact 84 and a lower contact 86 making direct contact with the upper layer 82 and lower layer 78, respectively.

The active layer 80 generates the optical signal emitted by the component 70 when a suitable potential difference is applied across the contacts 84 and 86.

Here, the lower layer 78 is optically coupled to the waveguide 76. To achieve this, the layer 78 is placed above the waveguide 76 and separated from this waveguide 76 by a thin sublayer 90 of buried oxide. For example, the sublayer 90 is made of silicon dioxide. The thickness of the oxide sublayer 90 is smaller than 100 nm and, preferably, smaller than 50 nm or 20 nm. Thus, the optical signal generated by the active layer 80 may then be guided by the waveguide 76.

In this embodiment, the waveguide 76 comprises:
a central rib 142 (FIG. 3),
two protuberances 144A and 144B (FIG. 3) lying parallel to the central rib 142, and two rims 146A and 146B (FIG. 3) that mechanically and thermally connect the central rib 142 to the protuberances 144A and 144B, respectively.

The thickness $e_{142}$, in the Z-direction, of the central rib 142 is generally smaller than 1 μm and, preferably, smaller than 500 nm. Here, the cross section of the rib 142 is rectangular and hence it has two parallel vertical walls.

The protuberances 144A and 144B are located on either side of the rib 142. Here, the cross section of each of these protuberances 144A, 144B is rectangular and hence they each also have vertical walls. The upper face of each of the protuberances 144A, 144B makes direct mechanical contact with the sublayer 90. The thickness, in the Z-direction, of the protuberances 144A and 144B is equal to or smaller than the thickness of the rib 142. Here, the thickness of the protuberances 144A, 144B is equal to the thickness of the rib 142.

The rims 146A and 146B are each located on a respective side of the rib 142. These rims extend, parallel to the X-direction, from a vertical wall of the rib 142 to a facing vertical wall of one of the protuberances 144A, 144B. The upper face of each rim 146A, 146B makes direct mechanical contact with the sublayer 90. The thickness $e_{146}$ of each rim 146A, 146B is smaller than the thickness $e_{142}$ of the rib 142 so as to confine the guided optical signal mainly to the rib 142. To this end, the thickness $e_{146}$, in the Z-direction, of the rims 146A, 146B is generally smaller than $0.5e_{142}$ or $0.33e_{142}$. To facilitate the conduction of heat from the rib 142 to the protuberances 144A, 144B, the thickness $e_{146}$ is also generally chosen to be larger than $0.1e_{142}$ or $0.2e_{142}$.

The rib 142, the protuberances 144A, 144B and the rims 146A, 146B are made of the same material so that, joined together, these various portions of the waveguide 76 form only a single piece of material. Here, the waveguide 76 is made of single-crystal silicon.

Here, waveguide 76 and optical component 72 are buried within an encapsulating sublayer 122 located directly below oxide sublayer 90. More specifically, the sublayer 122 extends from a sublayer 120 to the sublayer 90. The sublayer 122 is here divided into an upper optical-guide level 92 and a lower electrical-interconnect level 94.

The level 92 includes all optical components and portions of optical components produced under the sublayer 90. The level 92 therefore here comprises the waveguide 76, the optical component 72 and a solid dielectric material in which the optical components and portions of optical components are encapsulated. The optical components encapsulated in the sublayer 122 and, in particular their vertical walls and their lower faces, therefore make direct mechanical contact with the solid dielectric material. There is no cavity between the vertical walls of the encapsulated optical components and this solid dielectric material. For example, this level 92 is fabricated from a crystalline silicon sublayer in which the waveguide 76 and component 72 were fabricated before being encapsulated in the dielectric material.

The level 94 is devoid of optical component and of any portions of optical components. Here, as will be described below, the level 94 comprises interconnect metal networks encapsulated in a solid dielectric material. The dielectric material of the sublayer 122 has a refractive index lower than the refractive index of the material used to produce the waveguide 76 and the component 72. For example, the dielectric material is silicon dioxide.

The layers 78, 80 and 82 are for their part produced in a sublayer 128 located directly on the sublayer 90. The sublayer 128 here comprises a III-V material from which the layers 78, 80 and 82 are produced and a dielectric material that encapsulates the layers 78, 80 and 82. The sublayer 128 extends horizontally directly over the sublayer 90 and its upper face corresponds to the face 32.

To supply and/or transmit electrical signals through layer 38, this layer 38 comprises vias, which are referred to as "secondary vias". Each secondary via extends one primary via into optical layer 38. To this end, each secondary via extends from the bonding interface 40 into the layer 38. To limit the constraints to be met with respect to the layout of the optical components with respect to these secondary vias, the diameter of the secondary vias is much smaller than the diameter of the primary vias. Here, the diameter of the secondary vias is smaller than 3 µm and, preferably, smaller than 1 µm. To facilitate the production of such secondary vias, the thickness of the layer 38 is smaller than 15 µm or 8 µm or 5 µm.

Below, the secondary vias are classified into two categories. A first category dubbed "secondary through-vias" and a second category dubbed "secondary blind vias".

The secondary through-vias pass through the thickness of the layer 38 and therefore, in particular, the optical-guide level 92. They therefore extend vertically from the bonding interface 40 to the upper face 32. They are typically used to electrically connect electrical tracks formed on the upper face 32 to one of the primary vias. In contrast, the secondary blind via do not pass right through the thickness of the layer 38 and, in particular, do not pass through the optical-guide level 92. They therefore extend from the bonding interface 40 to an electrical contact, such as the contact 74, embedded in layer 38.

By way of illustration, FIG. 2 shows two secondary through-vias 100 and 102. The via 100 electrically connects the primary via 50 to an electrical track 106 produced on the face 32. Here, the track 106 electrically connects the upper end of via 100 to contact 84. The lower end of via 100 makes direct mechanical and electrical contact with the metal line 58.

The secondary through-via 102 electrically connects the primary via 51 to an electrical track 108 produced on the face 32. The track 108 electrically connects the end of via 102 to the contact 86. The lower end of via 102 makes direct mechanical and electrical contact with the metal line of the via 51. Here, the vias 100 and 102 are used to power component 70.

The structure of via 102 is identical to that of the via 100. Thus, only the structure of via 100 is described below in more detail.

In this embodiment, the via 100 has a lower portion 110 and an upper portion 112 arranged immediately one above the other. The portions 110 and 112 are produced, during fabrication, from opposite sides of the optical layer.

The lower portion 110 is an interconnect metal network. Here, this portion 110 comprises:
a metal line 114 embedded in level 94 of the sublayer 122,
a metal line 116 that lies flush with the bonding interface 40, and
metal vias 118 that extend vertically directly from the metal line 116 to the metal line 114.

The diameter of the lower portion 110 is defined in the same way as the diameter of the upper portion 58 of the primary via 50 was defined. The diameter of the portion 110 is smaller than 3 µm or 1 µm.

In this embodiment, the interconnect metal network that forms portion 110 comprises only two levels of metal lines. For example, these are the levels often designated by the references M4 and M5.

Generally, the height of this portion 110 is small, i.e. smaller than 6 µm or 3 µm or 1 µm.

Here, the metal line 116 is produced in a silicon-oxide sublayer 120 the lower face of which coincides with the bonding interface 40. The sublayer 120 is produced directly under the sublayer 122. Here, the sublayer 120 is made of silicon dioxide.

The metal vias 118 are located in level 94 of the sublayer 122.

The upper portion 112 of the secondary via 100 is formed from a coating 124 made of a conductive material. For example, the coating 124 is made of copper or of aluminum. This coating 124 continuously covers the vertical walls and the bottom of a hole 126 dug in the layer 38. More precisely, the hole 126 extends from the upper face 32 to the metal line 114. To this end, the hole 126 passes through, in succession, from top to bottom, the encapsulating layer 128, the sublayer 90, the optical-guide level 92 and a portion of the level 94 of the sublayer 122.

The maximum diameter of the hole 126 is smaller than 3 µm and, preferably, smaller than 1 µm. Thus, the maximum diameter of the upper portion 112 of the secondary via 100 is also smaller than 3 µm or 1 µm.

The upper portion of the coating 124 makes direct mechanical and electrical contact with the track 106, and its lower portion makes direct mechanical and electrical contact with the metal line 114. In the example of FIG. 2, the coating 124 does not completely fill the hole 126. The center of the hole 126 is therefore devoid thereof. To achieve this, for example, the thickness of the coating 124 is smaller than 500 nm or 300 nm. The center of the hole 126 is filled with an electrically non-conductive and passivating material. Advantageously, the coefficient of thermal expansion of this electrically non-conductive material is lower than $0.8C_{124}$, and preferably lower than $0.5C_{124}$ or $0.3C_{124}$, where $C_{124}$ is the coefficient of thermal expansion of the coating 124. Here, the center of the hole 126 is filled with the same dielectric material as the sublayer 122 is made of, i.e. silicon dioxide.

The layer 38 also includes a secondary blind via 130. The via 130 electrically connects the electrical contact 74 to the upper end of the primary via 52, with a view to reception of the electrical control signal for controlling the optical component 72. To this end, the via 130 extends vertically from the bonding interface 40 to the electrical contact 74. It therefore passes right through the sublayer 120 and the level 94 of the sublayer 122. In contrast, it does not pass through the optical-guide level 92 or the sublayer 90. The via 130 does not open onto the upper face 32, unlike a secondary through-via.

The via 130 is solely fabricated from the side of the layer 38 which faces the bonding interface 40. Here, the via 130 is formed by an interconnect metal network. In this embodiment, the via 130 comprises, from top to bottom:
four embedded metal lines 132 to 135,
metal vias 140 that electrically connect together the successive levels of metal lines, and
a metal line 138 that lies flush with the bonding interface 40 and that is located in the sublayer 120.

The metal line 138 makes direct mechanical and electrical contact with the upper end of the primary via 52. Here, the interconnect metal network comprises five different levels of metal lines. For example, these five levels of metal lines are often designated by the references M1 to M5, respectively. The diameter of the via 130 is also smaller than 3 µm or 1 µm.

The waveguide 76 of the laser source 70 comprises at least one electrical contact thermally coupled to one of the protuberances 144A, 144B or to the rib 142. Here, an electrical contact is said to be "thermally coupled" only if:
this electrical contact is located below the protuberance 144A or 144B or below the rib 142, and
separated from the protuberance 144A, 144B or from the rib 142 by a shortest vertical distance $d_v$ smaller than 500 nm and, preferably, smaller than 300 nm.

When the distance $d_v$ is non-zero, the electrical contact is mechanically isolated from the protuberance 144A, 144B or from the rib 142 by a thin film of the dielectric material of the sublayer 122. The minimum thickness of this film is equal to the distance $d_v$.

Figure 3:
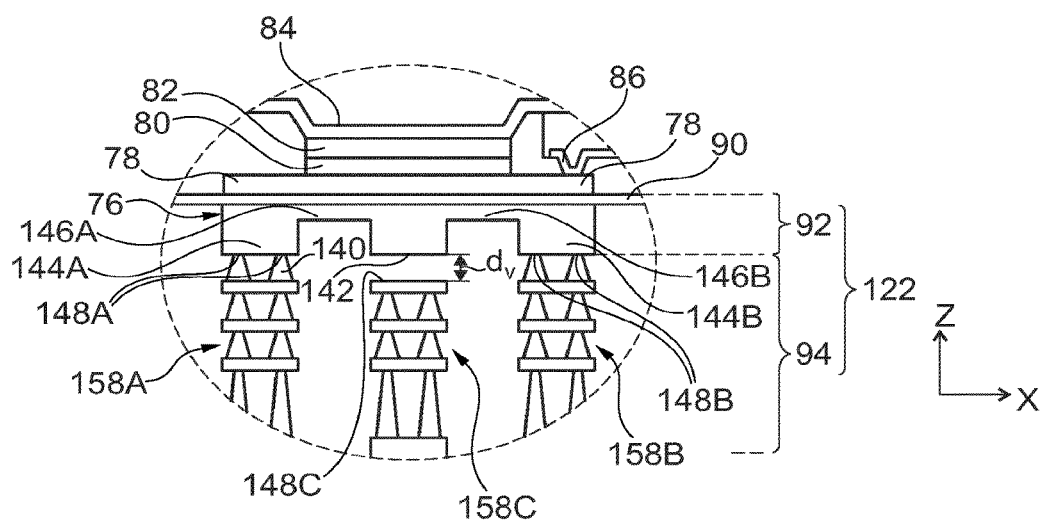
FIG. 3 is a schematic and partial illustration, in vertical cross section, of the cross section of a waveguide of the photonic chip of the system of FIG. 1.

In the embodiment shown in FIGS. 2 and 3, the waveguide 76 comprises three electrical contacts 148A, 148B and 148C (FIG. 3). Here, the contacts 148A, 148B are formed by the upper ends of metal vias 140 that bear mechanically directly against the lower faces of the protuberances 144A and 144B, respectively. Thus, the distance $d_v$ between the contacts 148A, 148B and the protuberances 144A and 144B, respectively, is zero in this embodiment. The contact 148C is here formed by a metal line located under the rib 142 and separated from the lower face of rib 142 by a non-zero distance $d_v$. Preferably, in this case, to effectively limit optical losses, the distance $d_v$ is chosen to be larger than 10 nm or 50 nm. For example, here, the contact 148C is formed in the M1 level of metal lines.

Each electrical contact 148A, 148B and 148C is thermally connected to the interconnect layer 36 by way of a blind vias 158A, 158B and 158C, respectively. The vias 158A, 158B and 158C are each structurally identical, for example, to the via 130. However, unlike the via 130, the function of the vias 158A, 158B and 158C is not necessarily to electrically connect the contacts 148A, 148B and 148C to a primary via of the layer 36. Here, the lower end of each via 158A, 158B and 158C makes direct mechanical and electrical contact with a metal line located in the sublayer 44, and which lies flush with the interface 40. This metal line is here electrically insulated from all the primary vias. The vias 158A, 158B and 158C are here made from a material that is a good thermal conductor. A material that is a "good thermal conductor" is typically a material the thermal conductivity of which is higher than $1.2C_{122}$, and preferably higher than $2C_{122}$ or $3C_{122}$, where $C_{122}$ is the thermal conductivity of the dielectric material of the sublayer 122. Here, the material used to produce the vias 158A, 158B and 158C is the same as that used to produce the via 130, i.e. a metal.

The layers 78 and 80 of the laser source 70 are thermally connected to the primary vias 50 and 51 by way of secondary vias 100 and 102, respectively. Thus, the heat produced by the laser source 70 is dissipated, in part, to the layer 36 by way of the secondary vias 100 and 102. The presence of the vias 158A, 158B and 158C improves the thermal dissipation of the heat produced by the laser source 70. Specifically, it is known to those skilled in the art that the waveguide 76 sees its temperature increase during the operation of the laser source 70. In the absence of vias 158A, 158B and 158C, the presence of the dielectric material of the sublayer 122 under the waveguide 76 prevents the produced heat from being removed effectively. The vias 158A, 158B and 158C each form, through the sublayer 122, a thermal bridge, here one made of metal, that thermally connects the waveguide 76 to the layer 36. This allows the heat produced by the laser source 70 to be more effectively removed.

Redistribution lines 150 (also known by the acronym RDL) are produced on the lower face 34 to electrically connect the lower ends of the primary vias to corresponding solder microbumps. To this end, the redistribution lines comprise connection pads to which the solder microbumps are directly fastened. In FIG. 1, only three solder microbumps 152 to 154 have been shown. These microbumps 152 to 154 are intended to be soldered to corresponding pads on the upper face of the carrier 14 and therefore form part of the solder microbump array 22. Here, the lines 150 are embedded in an encapsulating layer 156 made of an electrically non-conductive material such as a polymer.

Figure 4:
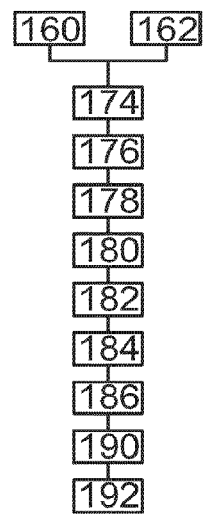
FIG. 4 is a flowchart of a process for fabricating the system of FIG. 1.
Figure 5:
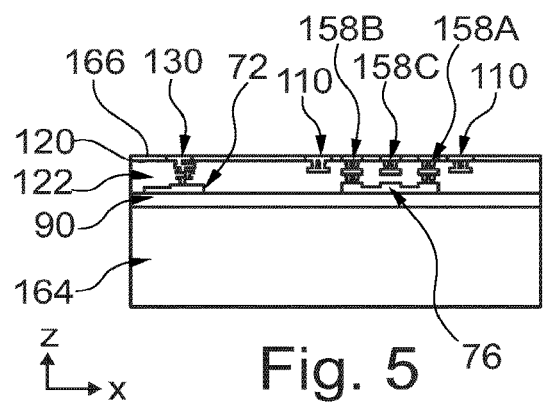
FIGS. 5 to 11 are schematic illustrations, in vertical cross section, of various states of fabrication of the photonic chip of FIG. 2.
Figure 6:
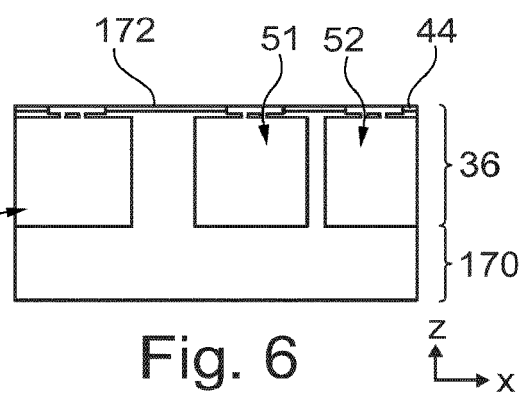

A process for fabricating the system 2 will now be described with reference to FIG. 4, and to the various fabrication states shown in FIGS. 5 to 11.

Initially, in a step 160, the stack of sublayers 90, 122 and 120 is fabricated on a handle 164 (FIG. 5) then provided. Here, this stack forms only one portion of the optical layer 38 because, at this stage, notably, the layer 128 is missing. At this stage, the sublayer 120 is located on the side opposite the handle 164 and has a bonding face 166. This face 166 is suitable for being bonded to another substrate by direct bonding, i.e. by bonding that does not require the addition of material.

Step 160 also comprises:
producing the waveguide 76 and the optical component 72 in the level 92 of the sublayer 122,
constructing the secondary via 130 and the vias 158A, 158B and 158C, and
producing the lower portions 110 of the secondary vias 100 and 102.

The sublayer 90 is fastened directly to the handle 164. The handle 164 is a carrier that allows the stack of the sublayers 120, 122 and 90 to be easily handled. To this end, the thickness of the handle 164 is typically larger than 250 μm or 500 μm. For example, here, the handle 164 is a silicon substrate with a thickness of 750 μm or 775 μm.

Preferably, the sublayer 90 is the buried oxide layer of a silicon-on-insulator (SOI) substrate. In this case, the waveguide 76 and the component 72 are produced, typically by etching, in the single-crystal silicon layer of this SOI substrate. Once the waveguide 76 and the optical component 72 have been produced on the sublayer 90, they are buried in the dielectric material of the sublayer 122 by depositing, in succession, a plurality of oxide layers one after the other. During the deposition of these successive oxide layers, the interconnect metal networks forming the contacts 148A, 148B, 148C, the secondary via 130, the vias 158A, 158B and 158C and the lower portions 110 of the secondary vias 100 and 102 are produced. Thus, these interconnect metal networks are produced from the side opposite the handle 164. Processes for producing the optical components on the sublayer 90, processes for embedding the components in the sublayer 122 and processes for producing interconnect metal networks are well known and are therefore not described in more detail here. It will be noted that, at this stage of the fabricating process, production of the upper portions 112 of the secondary vias 100 and 102 is impossible. The sublayer 122 therefore does not comprise, at this stage, the upper portions 112 of the vias 100 and 102.

In parallel, in a step 162, the interconnect layer 36 is fabricated on a handle 170 (FIG. 6) then provided. In this state, the layer 36 has an outer face 172 located on the side opposite the handle 170. This face 172 is a bonding face, i.e. one that is able to be bonded, by direct bonding, to the face 166. The thickness of the handle 170 is larger than 250 μm or 500 μm to allow easy handling of the layer 36. Here, the handle 170 is for example a silicon substrate.

Step 162 also comprises producing the primary vias 50 to 52 in the layer 36. Thus, at the end of step 162, the layer 36 comprises these primary vias 50 to 52. The production of such a layer 36 on the handle 170 and the production of the vias 50 to 52 in this layer 36 are conventional operations. For example, the portions 54 of the vias 50 to 52 are produced using a dielectric coating that is covered with a barrier layer of titanium or tantalum and filled with copper. A process for fabricating these portions 54 is for example described in the article by Ken Miyairi cited above. Next, the metal vias 60 are produced, so as to make electrical contact with the portions 54 of the primary vias. Lastly, metal lines, such as the metal line 58, are produced and then encapsulated in the oxide sublayer 44. The outer face of the sublayer 44 is then prepared for its direct bonding to the face 166.

Figure 7:
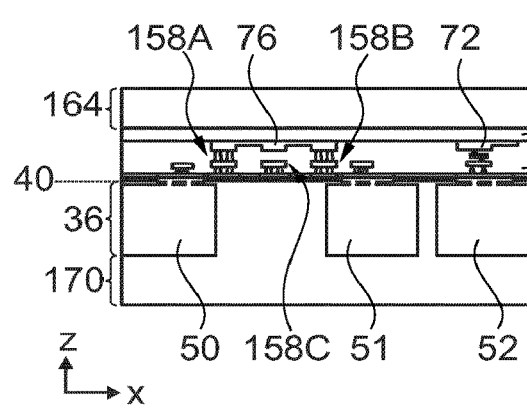

In a step 174, the faces 166 and 172 are bonded, by direct bonding, to each other. This is shown in FIG. 7. The bonding interface 40 is then obtained. For example, it is a question of direct hybrid copper-oxide bonding such as described in the following article: Yan Beillard et al.: "Chip to wafer copper direct bonding electrical characterization and thermal cycling", 3D Systems Integration Conference (3DIC), 2013 IEEE International.

Figure 8:
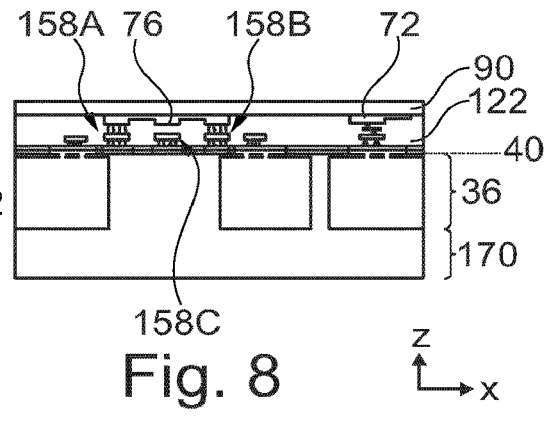
Figure 9:
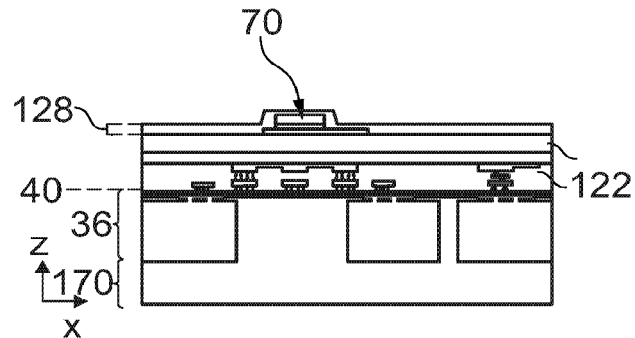

Next, in a step 176, the handle 164 is removed in order to expose the sublayer 90 (FIG. 8). For example, the handle 164 is removed by chemical-mechanical polishing (CMP) followed by selective chemical etching.

In a step 178, the light-amplifying portion of the component 70 is produced on the sublayer 90, on the side opposite the optical-guide level 92 (FIG. 9) and encapsulated in the dielectric material of the encapsulating layer 128.

Figure 10:
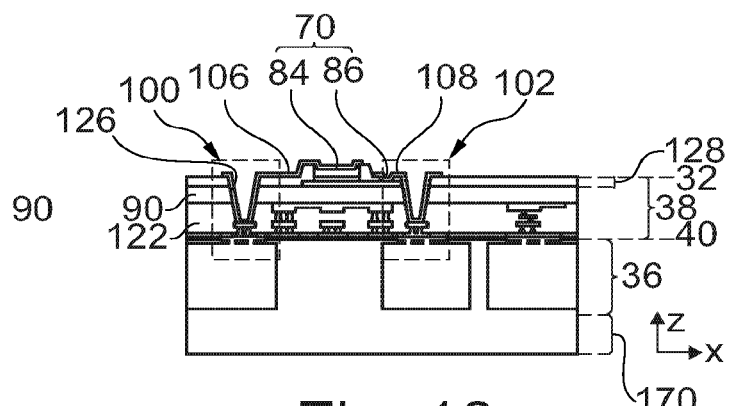
Figure 11:
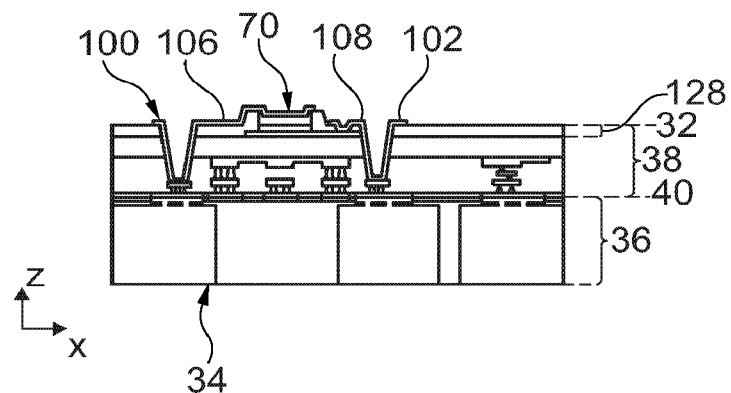

In a step 180, the contacts 84, 86, the electrical tracks 106 and 108 and the upper portions 112 of the secondary vias 100 and 102 are produced (FIG. 10). For example, holes such as the hole 126 are first dug through the sublayers 128, 90 and the level 92 of the sublayer 122. Next, a coating made of conductive material is deposited over the entire outer face. Lastly, this conductive coating is etched so that the conductive coating remains only in the locations of the contacts 84, 86, of the tracks 106 and 108 and of the upper portions 112 of the secondary vias 100 and 102. The production of the layer 38 is thus completed.

In a step 182, the handle 170 is then removed in turn to expose the lower face 34 (FIG. 116).

In a step 184, the redistribution lines 150, the solder microbumps 152 to 154 and the encapsulating layer 156 are produced on the exposed lower face 34. The fabrication of the photonic chip 18 is thus completed.

In a step 186, the electronic chip 16 and the photonic chip 18 are soldered to pads on the upper face of the carrier 14. The chips 16 and 18 are then electrically connected to each other by way of horizontal connections on the carrier 14.

In a step 190, the carrier 14 and the chips 16 and 18 are encapsulated in an electrically non-conductive material that is a good thermal conductor, i.e. a material such as an epoxy resin. In addition, preferably, a cover on which a heat sink, such as a radiator, is located is fastened to the upper faces of the chips 16 and 18. This cover is for example adhesively bonded, using a thermally conductive adhesive, directly to the upper face 32 of the photonic chip 18 and the upper face of the chip 16. Thus, these upper faces may make direct contact with the thermal adhesive, which makes contact with the cover. This is made possible by the fact that electrical power and the electrical signals are all routed via the lower faces of chips 16 and 18.

Next, in a step 192, the system 2 is for example soldered to the printed circuit board 4.

Figure 12:
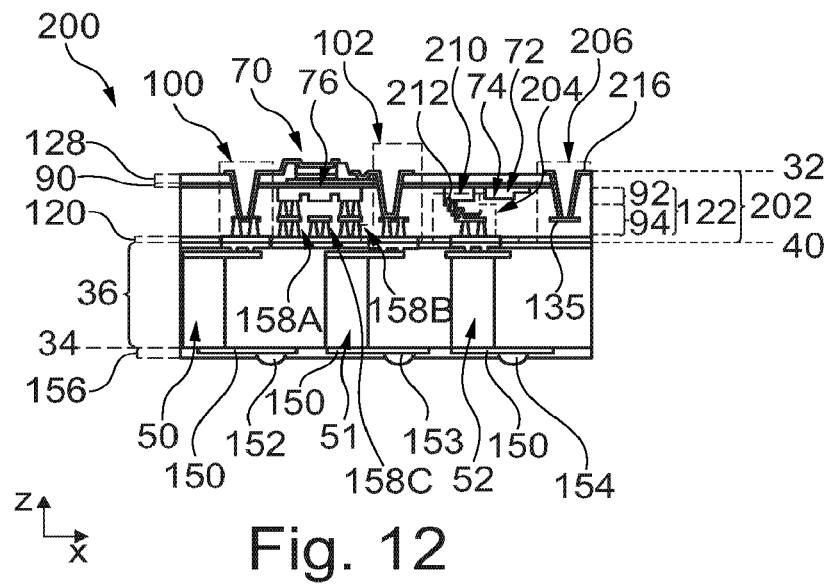
FIG. 12 is a schematic illustration, in vertical cross section, of a first variant of the photonic chip of FIG. 2.

FIG. 12 shows a photonic chip 200 that may be used instead of the photonic chip 18 in the system 2. The chip 200 is identical to the chip 18 except that:
- the optical layer 38 has been replaced by an optical layer 202,
- the secondary via 130 has been replaced by a secondary blind via 204, and
- the photonic chip 200 comprises a tertiary via 206.

The optical layer 202 is identical to optical layer 38 except that it in addition comprises an active electronic component 210 buried in level 92 of the sublayer 122. This electronic component 210 is qualified active because, to operate, it needs to be supplied with electricity, and it emits and/or receives an electrical signal. To this end, the component 210 comprises an electrical contact 212 on its lower face. This electrical contact 212 is therefore embedded in the sublayer 122 and faces the bonding interface 40.

Here, the secondary via 204 electrically connects the electrical contact 212 of the electronic component 210 to the primary via 52, solely passing through the lower level 94 of the sublayer 122 and the sublayer 120 to do so. The electronic component 210 is, for example, intended to supply, from an electrical signal that it receives via the primary via 52, an electrical control signal to the optical component 72. To this end, the component 210 comprises, on its lower face, another electrical contact connected to the contact 74 of the component 72. To achieve this, the interconnect metal network located in the level 94 of the sublayer 122 is modified to create a path that electrically connects together this other electrical contact and the contact 74. To simplify FIG. 12, this modification of the interconnect metal network has not been shown in FIG. 12. The structure and fabrication of via 204 may be deduced from the explanations given with respect to the via 130.

The via 206 is a via that electrically connects a metal line 135, embedded in the level 94 of the sublayer 122, to an electrical track 216 produced on the upper face 32. The via 206 extends vertically from the face 32 to the embedded metal line 135, and notably passes through the sublayer 90 and the optical-guide level 92 to do so.

The electrical track 216 comprises a test pad that allows the operation of the components 210 and/or 72 to be tested during the fabricating process of the photonic chip 200 and, in particular, before the removal of the handle 170. To this end, though not shown in FIG. 12, the interconnect metal network located in level 94 of sublayer 122 is also modified to create, using the metal lines and metal vias, an electrical path that electrically connects the electrical contacts 212 and/or 74 to the metal line 135.

The structure of via 206 is here identical to that of via 100 except that it is devoid of lower portion 110. Typically, the via 206 is fabricated in the same way as the upper portion 112 of the via 100 and generally at the same time as this upper portion 112.

Figure 13:
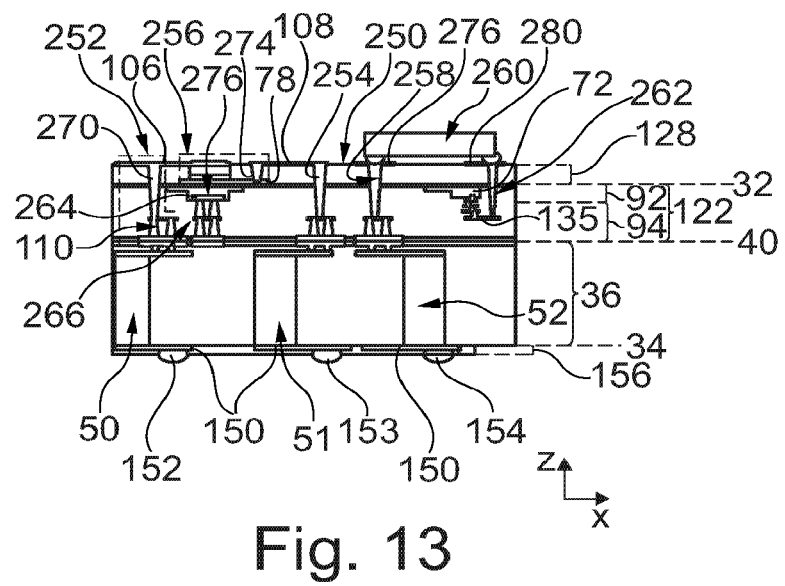
FIG. 13 is a schematic illustration, in vertical cross section, of a second variant of the photonic chip of FIG. 2.

FIG. 13 shows a photonic chip 250 that may be used instead of the photonic chip 18 in the system 2. The photonic chip 250 is identical to the photonic chip 18 except that:
- the secondary through-vias 100 and 102 have been replaced by secondary through-vias 252 and 254, respectively,
- the component 70 has been replaced by a laser source 256,
- the secondary via 130 has been replaced by a secondary through-via 258, an electronic chip 260 and a tertiary via 262.

The secondary through-vias 252 and 254 are identical to the vias 100 and 102, respectively, except that their upper portions 270 are produced differently. More precisely, the upper portion 270 is here a solid via. In other words, the upper portion 270 is identical to the upper portion 112, except that the central hollow of the hole 126 is filled with a conductive material. Generally, in this case, the maximum diameter of the upper portion 270 of the vias 252 and 254 is smaller than 1 µm.

The laser source 256 is identical to the component 70, except that:
the contact 86 has been replaced by a contact 274, and
the waveguide 76 has been replaced by a waveguide 276.
The contact 274 is a metal via that electrically connects the layer 78 to the electrical track 108.

The waveguide 276 is identical to the waveguide 76 except that the protuberances 144A and 144B have been omitted. Likewise, the contacts 148A, 148B and vias 158A and 158B have been omitted. In addition, the thickness of the central rib 142 is then chosen so that the optical signal guided by the laser source 256 is mainly located in the layer 80. For example, to this end, the thickness $e_{142}$ is smaller than 300 nm or 200 nm. Lastly, in this embodiment, the contact 148C has been replaced by a contact 264 for which the distance $d_v$ between this contact 264 and the lower face of the rib 142 is zero. The via 158C has been replaced by a via 266 the structure of which is, for example, identical to that of the via 158A or 158B described above.

The secondary through-via 258 electrically connects the primary via 52 directly to an electrical track 276 produced on the upper face 32. The track 276 comprises a pad to which a first electrical contact of the electronic chip 260 is soldered. The structure of the via 258 is here identical to that of the via 252.

The via 262 electrically directly connects an electrical track 280 produced on the upper face 32 to the metal line 135 embedded in the level 94 of the sublayer 122. To this end, for example, the structure of the via 262 is identical to the structure of the via 252 except that the lower portion 110 is omitted. The electrical track 280 comprises a pad to which a second electrical contact of the electronic chip 260 is soldered.

Here, the metal line 135 is electrically connected to the electrical contact 74 of the optical component 72 by way of an interconnect metal network similar to that described with reference to FIG. 12. Typically, the electronic chip 260 is a transducer which is electrically powered by way of primary vias and which controls the optical component 72 depending on electrical signals received by way of a primary via, via 52 for example.

Section II: Variants

Section II.1: Variants of the Vias

The horizontal cross section of a via is not necessarily circular. For example, the cross section of a via may be square or rectangular. In this case, by "diameter" what is meant is the hydraulic diameter of this horizontal cross section.

As illustrated in the case of the secondary via in the preceding embodiments, the diameter of the via is not necessarily constant over its entire height. In this case, by "diameter" of the via, what is meant is the largest diameter of this via along its height.

As a variant, the upper portion 56 of the primary via is omitted. In this case, the upper end of the portion 54 of the primary via lies flush with the bonding interface 40 directly.

In another variant, the metal vias 60 are omitted. In this case, the upper end of the portion 54 makes direct mechanical and electrical contact with the metal line 58.

In another embodiment, the upper portion 56 of a primary via may comprise a plurality of additional metal lines produced at various depths in the sublayer 44. The various levels of metal lines of the portion 56 are then electrically connected together by metal vias. These additional metal lines then form a redistribution layer or RDL that allows, for example, a plurality of metal lines that lie flush with the interface 40 to be electrically connected together.

The interconnect metal network used to form the lower portion of a secondary through-via may also, as a variant, comprise more than three levels of metal lines.

As a variant, the lower portion 110 of a secondary through-via is omitted. In this case, the bottom of the hole 126 then opens directly onto the metal line 58 of the primary via. Such a secondary through-via then comprises only a single portion, namely the portion 112.

The center of the hole 126 may also be filled with a dielectric material different from the dielectric material of the sublayer 122. For example, it is filled with an organic material.

In another embodiment, the upper portion 112 of a secondary via is produced using one or more metal vias that each extend from the face 32 to the metal line 114.

If it is not necessary to relax the constraints to be met with respect to the layout of the optical components with respect to the secondary vias, the diameter of the secondary vias may be larger than 3 µm and, in particular, equal to or larger than the diameter of the primary vias.

As a variant, the distance $d_v$ between the contacts 148A, 148B and the protuberances 144A, 144B is non-zero. In this case, the distance $d_v$ is for example chosen as described in the case of the contact 148C.

In one particular embodiment, the via 148C is omitted. In this case, the heat from the waveguide 76 is dissipated only by way of the vias 158A and 158B.

Section II.2: Other Variations of the Structure of the Photonic Chip

As a variant, the interconnect layer 36 may be made from materials other than silicon. For example, it may be made of glass.

As another variant, the layer 36 comprises one or more electronic components.

The sublayers of the optical layer 38 may also be made from other materials. In particular, the sublayer 122 may be produced using another dielectric material such as, for example, amorphous silicon, silicon nitride (SiN), or silicon oxynitride (SiON).

The various oxide sublayers of the layer 38 are not necessarily all made from the same oxide. As a variant, the sublayer 120 may be made from an oxide different to that used to make the sublayer 90. It is also possible to use, to produce the sublayer 122, an oxide that is different from that of the sublayer 90.

The optical layer may in addition be passed through by additional vias the diameter of which is larger than 3 µm and, for example, larger than 10 µm or 20 µm. In this case, an exclusion zone of large area is provided around each of these additional vias and no optical component is produced in this exclusion zone. This exclusion zone is dimensioned according to the teaching given in the following article: Yan Yang et al.: "*Though—Si—via (TSV), Keep—Out—Zone (KOZ) in SOI photonics interposer: A study of impact of TSV-Induced stress on Si ring resonators*", IEEE Photonics Journal, volume 5, Number 6, December 2013. Below, this article will be referred to as "Yang2013". However, even if the photonic chip comprises a few of these additional vias, the arrangement of the optical components in the optical layer is still simplified because the presence of the secondary vias still limits the constraints on the layout of the optical components.

Any number of optical components may be buried in level 92 of sublayer 122. In addition, the various optical components are not necessarily buried at the same depth in level 92. This is notably the case if the optical components or portions of optical components are fabricated from various sublayers of material stacked on top of one another. These material sublayers may then be chosen from the group consisting of a crystalline-silicon sublayer, an amorphous-silicon sublayer, a sublayer of silicon nitride (SiN) and a sublayer of silicon oxynitride (SiON).

As a variant, the lower end of one or more of the vias 158A, 158B, 158C and 266 is electrically and mechanically connected to at least one primary via in order to improve the thermal dissipation of the heat produced by the laser source. Thus, in a first embodiment, the lower end of at least one of the vias 158A, 158B and 266 is electrically and mechanically connected to a primary via used to electrically connect one of the components of the chip 18 to the carrier 14. For example:
  the lower ends of the vias 158A and 158B are electrically and mechanically connected to the primary vias 50 and 51, respectively, or
  the lower ends of vias 158A and 158B are both electrically and mechanically connected to the primary via 50 or 51 or 52, or
  the lower end of via 266 is electrically and mechanically connected to the primary via 50 or 51 or 52.

In a second embodiment, the lower end of at least one of the vias 158A, 158B and 266 is electrically and mechanically connected to an additional primary via. This additional primary via is electrically isolated. It is therefore electrically isolated from the primary vias 50, 51 and 52. This additional primary via is therefore not used to make an electrical connection. For example, the lower end of via 158A or 158B is electrically and mechanically connected to such an additional primary via.

The diameter of one or more of the vias 158A, 158B, 158C and of the via 266 is not necessarily smaller than 3 μm or 1 μm. Its diameter may also be larger than these values.

The use of the vias 158A, 158B, 158C and 266 to improve the dissipation of the heat produced by a laser source applies similarly to the improvement of the dissipation of the heat produced by any type of optical or electronic component at least one portion of which is embedded in the sublayer 122. For example, a via similar to via 158C or 266 may also be used to dissipate the heat produced by the optical component 72 or the electronic component 210.

Other embodiments of the waveguide 76 are possible. For example, as a variant, the protuberance 144B and the rim 146B are omitted. In this case, the contact 148B and the via 158B are also omitted. The thickness of the protuberances 144A, 144B may be larger than the thickness $e_{142}$ of the rib 142. As another variant, only the protuberances 148A and 148B are omitted and the rims 146A and 146B are retained. In the latter case, the contacts 148A and 148B may be formed under the rims 146A and 146B, respectively, in the same way as was described for the case where they are formed under the protuberances 148A, 148B.

Section II.3: Other Variants

The photonic chip may comprise, on the upper face 32, an electrical track that is not necessarily used to electrically connect an optical component to one of the primary vias. For example, as described with respect to the embodiment of FIG. 13, such an electrical track 276 may solely be used to electrically connect an electronic chip soldered on the upper face 32 of the photonic chip to one of the primary vias.

In one embodiment, the photonic chip comprises solely secondary blind vias. In this case, all the secondary blind vias are fabricated from the side opposite the handle 164. The order of removal of the handles may then be inverted. Thus, the handle 170 may be removed before the handle 164. Specifically, it is not necessary to fabricate the upper portion 112 of the secondary through-vias. Also in this case, the secondary blind via is entirely fabricated before the layer 38 is bonded to the layer 36.

In another embodiment, the photonic chip comprises solely secondary through-vias.

Alternatively, the chip 260 may correspond to the chip 16 of FIG. 1. In this case, the electronic chip 260 is an ASIC that is powered electrically by way of the primary vias, and that controls the optical component 72 with the electric signals that it generates.

Other fabricating processes are also possible.

A portion of the component 70 or of the laser source 256 may be thermally connected to the interconnect layer by way of secondary, and typically blind, vias, such as the vias 158A, 158B, 158C and 266, independently of the other features described here of the photonic chip. In particular, such a thermal connection may be made in a context in which the primary vias pass through the optical layer as described in the article Yang2013 or in a context in which all the primary vias are omitted. When the primary vias are omitted, the layer 36 is no longer an interconnect layer but simply a carrier for the optical layer 38. When the primary vias are omitted, preferably, the thickness of the surface sublayer 44 is sufficiently small to not thermally insulate the secondary vias of the sublayer 42. For example, in this case, the surface sublayer 44 is omitted or its thickness is smaller than 100 nm or 50 nm. If the thickness of the surface sublayer 44 is large, i.e. larger than 100 nm or 300 nm, the upper portion 56 may be retained to form a thermal bridge that passes through the sublayer 44 and only the lower portion 54 of the primary vias is omitted. In this case, the upper portion 56 may be electrically insulated from the silicon sublayer 42 by a thin layer of dielectric material with a thickness of smaller than 100 nm or than 50 nm.

Section III: Advantages of the Described Embodiments

Thermally connecting the waveguide 76 or 276 to the interconnect layer by way of a via the lower end of which makes direct mechanical contact with the layer 36, allows the thermal dissipation of the heat produced by the laser source during its operation to be improved with respect to the embodiments described in the article by J. Durel et al. cited in the introduction of this patent application. In addition, the fabrication of the photonic chip remains particularly simple. In particular, the fact that the vias 158A, 158B, 158C and 266 are formed by interconnect metal networks simplifies the fabrication of these vias and therefore of the photonic chip. The fact that these vias are solely located in the lower interconnect level 94 allows the constraints on the layout of the optical components to be limited with respect to the case where vias that in addition pass through the upper optical-guide level 92 are used to create these thermal bridges between the waveguide 76, 276 and the layer 36.

It is known to the inventors that, normally, the presence of an electrically conductive contact bearing directly against a portion of a waveguide increases the optical losses of this waveguide. However, such an increase in optical losses must, preferably, be limited as much as possible. In this context, combining, in the same embodiment, a thickness $e_{142}$ of the central rib 142 of smaller than 300 nm and a zero distance $d_v$ between the contact 264 and the central rib 142 allows the dissipation of heat to be improved without however substantially increasing optical losses. Specifically, when the thickness $e_{142}$ is smaller than 300 nm, most of the guided optical signal is confined to the active layer 80. In this case, the fact that the contact 264 bears mechanically directly against the rib 142 increases the optical losses very little.

The fact that the distance between the contact 148C and the lower face of the rib 142 is larger than 10 nm or 50 nm allows optical losses to be limited. In addition, the fact that this distance $d_v$ is also smaller than 500 nm allows the dissipation of heat to the layer 36 to be improved.

The use of protuberances 144A, 144B and of vias 158A, 158C the upper end of which bears directly on these protuberances 144A, 144B also allows the dissipation of heat to be improved without however substantially increasing optical losses. Specifically, because of the rims 146A, 146B, the optical signal guided in the protuberances 144A, 144B is negligible. Thus, the fact that these protuberances bear directly against the upper end of the vias 158A, 158B hardly increases the optical losses at all while nonetheless improving the dissipation of heat.

It is known that the presence of through-vias nearby an optical component causes problems. Specifically, such vias are made of an electrically conductive material the coefficient of thermal expansion of which is different from the material from which the optical component is made. Thus, in response to temperature variations, the through-vias exert, on the nearby optical component, a mechanical stress that varies as a function of temperature. This variation in mechanical stress modifies the optical properties of the optical component and causes a modification of the properties of this optical component. For example, when the optical component is an optical filter, this modifies its central wavelength. Such variations in the properties of the optical component must be avoided. In the described embodiments, the primary vias do not exert substantial mechanical stresses on the optical components. Specifically, the interconnect layer 36 is completely devoid of optical component. The optical components are solely located in the optical layer. Therefore, the optical components may be laid out, with respect to one another, without worrying about the arrangement of the primary vias. In particular, it is not necessary to respect any exclusion zone around each primary via. The secondary through-vias that pass through the optical-guide level 92 for their part have a diameter that is preferably smaller than or equal to 3 µm, or even to 1 µm. Such secondary through-vias may thus be placed 4 µm or even 2 µm from the optical components without exerting mechanical stresses on the latter. By comparison, the through-vias described in Yang2013, which had a diameter larger than 10 µm, had to be placed 40 µm from the optical components to not stress them mechanically. It is therefore possible to place the optical components much closer to the secondary vias than what would have been possible if their diameter were equal to the diameter of the primary vias. The combination, in the same photonic chip, of primary vias and secondary vias therefore allows a photonic chip to be obtained that is thick enough to achieve an acceptable bow, while limiting the constraints to be met with respect to the arrangement of the optical components relative to the vias. It will also be noted that the interconnect layer does not necessarily contain a layer of buried silicon oxide. The smallest thickness thereof resulting in an acceptable bow is therefore smaller than that of a layer containing a buried silicon oxide. Decreasing the thickness of the interconnect layer notably allows the parasitic capacitances of the primary vias to be decreased. Specifically, this parasitic capacitance is proportional to the height of the primary vias.

As regards the chips 18, 200 and 250, placing the laser source on the upper face of the oxide layer 90 facilitates its cooling from the outside, notably by virtue of the packaging of the system.

The fact that the center of the hole 126 is filled with an electrically non-conductive material the coefficient of thermal expansion of which is lower than that of the coating 124 allows the mechanical stresses exerted by the secondary via on nearby optical components to be further decreased.

The invention claimed is:

1. A photonic chip that lies essentially in a plane of the chip, comprising:
   a substrate having upper and lower faces parallel to the plane of the chip, the substrate comprising, between the upper and lower faces:
   a carrier of thickness larger than 50 µm and being devoid of an optical component,
   an optical layer bonded, via a bonding interface, to the carrier, the optical layer comprising, in succession, from the upper face to the bonding interface:
   an oxide sublayer, and
   an encapsulating sublayer, and
   a laser source buried in the optical layer, the laser source comprising a waveguide formed on a side of the oxide sublayer which faces the bonding interface and that is encapsulated in a dielectric material of the encapsulating sublayer, the waveguide comprising a first electrical contact embedded in the encapsulating sublayer,
   wherein the photonic chip comprises an interconnect metal network forming a via that extends, in the optical layer, from the bonding interface to the first embedded electrical contact of the waveguide, the interconnect metal network comprising metal vias that electrically connect together metal lines that extend mainly parallel to the plane of the chip, the metal lines being arranged one above the other within the optical layer.

2. The photonic chip as claimed in claim 1, wherein:
   the waveguide comprises a central rib, and
   the first embedded electrical contact is located, in a direction perpendicular to the plane of the chip, under a lower face of the central rib which faces the bonding interface and is separated from the lower face of the central rib by a distance comprised between 0 nm and 500 nm.

3. The photonic chip as claimed in claim 2, wherein:
   a thickness of the central rib is smaller than 300 nm, and
   the first embedded electrical contact makes direct mechanical contact with the central rib.

4. The photonic chip as claimed in claim 2, wherein the first embedded electrical contact is separated from the lower face of the central rib by a distance comprised between 10 nm and 500 nm.

5. The photonic chip as claimed in claim 1, wherein:
   the waveguide comprises a central rib, at least one lateral protuberance and at least one rim connecting the lateral protuberance to the central rib, a thickness of the rim being at least two times smaller than a thickness of the central rib, and
   the first embedded electrical contact makes direct mechanical contact with a lower face of the lateral protuberance, the lower face of the lateral protuberance facing the bonding interface.

6. The photonic chip as claimed in claim 1, wherein a maximum diameter of the metal vias of the interconnect network is smaller than 3 µm.

7. The photonic chip as claimed in claim 1, wherein:
the carrier is an interconnect layer,
the substrate comprises an electrical terminal chosen from the group consisting of a second electrical contact embedded in the optical layer, the second electrical contact being that of an optical component or of an electronic component, and an electrical track produced on the upper face of the substrate,
the photonic chip comprises:
   electrical connection pads produced on the lower face of the substrate, each of these pads being able to be electrically connected by way of a solder bump to another carrier, and
   a primary via extending through the interconnect layer from the lower face so as to electrically connect one of the electrical connection pads to the electrical terminal, this primary via having a diameter larger than or equal to 10 µm,
a thickness of the optical layer is smaller than 15 µm,
the primary via extends through the interconnect layer solely between the lower face and the bonding interface and does not extend into the optical layer, and
the photonic chip comprises a secondary via that extends the primary via into the optical layer so as to electrically connect the primary via to the electrical terminal, the secondary via extending in the optical layer from the bonding interface to the electrical terminal, a maximum diameter of the secondary via being smaller than 3 µm.

8. The photonic chip as claimed in claim 7, further comprising a via that extends, in the optical layer, from the bonding interface to the first embedded electrical contact of the waveguide and is electrically isolated from each and every primary via.

9. The photonic chip as claimed in claim 1, wherein:
the waveguide comprises at least one of the following elements:
   a central rib,
   a lateral rim that is mechanically connected to the central rib, a thickness of the lateral rim being at least two times smaller than a thickness of the central rib, and
   a lateral protuberance connected to the central rib by the lateral rim, and
the first electrical contact is located, in a direction perpendicular to the plane of the chip, at less than 500 nm from the central rib or from the rim or from the lateral protuberance.

10. A process for fabricating a photonic chip as claimed in claim 1, wherein the process comprises the following steps:
providing at least one portion of the optical layer fastened to a first handle of thickness larger than 250 µm, said at least one portion of the optical layer comprising in succession, with distance from the first handle:
an oxide sublayer,
an encapsulating sublayer, and
a first bonding face,
said at least one portion of the optical layer also comprising:
   a waveguide produced on the side of the oxide sublayer which faces the side of the bonding interface and is encapsulated in a dielectric material of the encapsulating sublayer, the waveguide comprising a first electrical contact embedded in the encapsulating sublayer, and
   an interconnect metal network forming a via that extends, in the encapsulating sublayer, from the first bonding face to the first electrical contact of the waveguide, the interconnect metal network comprising metal vias that electrically connect together metal lines that extend mainly parallel to the plane of the chip, the metal lines being arranged one above the other within the encapsulating sublayer,
providing the carrier of thickness larger than 50 µm fastened to a second handle of thickness larger than 250 µm, the carrier comprising:
   a second bonding face on the side opposite to the second handle, and
   the carrier being devoid of optical component, then
bonding the first bonding face to the second bonding face to obtain the bonding interface, then
removing the first handle to expose the oxide sublayer of said at least one portion of the optical layer, and then
producing a portion for amplifying the light of a laser source on the exposed oxide sublayer, the laser source comprising the waveguide.

\* \* \* \* \*